United States Patent
Ouyang et al.

(10) Patent No.: US 8,742,782 B2
(45) Date of Patent: Jun. 3, 2014

(54) NONCONTACT ELECTRICAL TESTING WITH OPTICAL TECHNIQUES

(75) Inventors: Xu Ouyang, Hopewell Junction, NY (US); Tso-Hui Ting, Stormville, NY (US); Ping-Chuan Wang, Hopewell Junction, NY (US); Yongchun Xin, Pouhgkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 369 days.

(21) Appl. No.: 13/191,555

(22) Filed: Jul. 27, 2011

(65) Prior Publication Data

US 2013/0027051 A1  Jan. 31, 2013

(51) Int. Cl.
*G01R 31/28* (2006.01)

(52) U.S. Cl.
USPC .............. 324/750.3; 324/754.23; 324/762.01; 324/762.03; 324/762.05

(58) Field of Classification Search
USPC ................. 324/500, 501, 537, 750.3, 754.01, 324/754.21, 754.23, 762.01, 762.03, 324/762.05, 762.06, 96, 97; 257/48; 438/14–18; 356/237.1, 237.6; 385/4–10, 14
See application file for complete search history.

(56) References Cited

U.S. PATENT DOCUMENTS

| | | | |
|---|---|---|---|
| 5,267,336 A | 11/1993 | Sriram et al. | |
| 5,387,788 A | 2/1995 | Miller et al. | |
| 6,686,993 B1 | 2/2004 | Karpman et al. | |
| 6,803,960 B2 | 10/2004 | Shepherd et al. | |
| 6,815,973 B1 | 11/2004 | Conn | |
| 6,897,663 B1 | 5/2005 | Conn | |
| 7,215,133 B2* | 5/2007 | Kwark | 324/762.03 |
| 7,224,174 B1* | 5/2007 | Malendevich et al. | 324/750.23 |
| 7,315,663 B2* | 1/2008 | Wu | 385/9 |
| 7,474,112 B2* | 1/2009 | Wills | 324/750.3 |
| 7,585,664 B2 | 9/2009 | Chan et al. | |
| 2005/0103984 A1* | 5/2005 | Feng | 250/215 |
| 2007/0004063 A1* | 1/2007 | Aghababazadeh et al. | 438/18 |
| 2010/0283499 A1* | 11/2010 | Bourdreau et al. | 324/765 |

FOREIGN PATENT DOCUMENTS

| | | |
|---|---|---|
| EP | 0595196 A1 | 5/1994 |
| EP | 1365535 A2 | 11/2003 |

* cited by examiner

*Primary Examiner* — Huy Q Phan
*Assistant Examiner* — James Split
(74) *Attorney, Agent, or Firm* — Cantor Colburn LLP; Ian MacKinnon

(57) ABSTRACT

An on-chip technique for noncontact electrical testing of a test structure on a chip is provided. On-chip photodiodes receives pump light from a pump light source, where the on-chip photodiodes are electrically connected to the test structure and are configured to generate power for the test structure. An on-chip coupling unit receives probe light from a probe light source, where the on-chip coupling unit is optically connected to on-chip waveguides through which the probe light is transferred. On-chip switches open in response to receiving voltage output from the test structure, and the on-chip switches remain closed when the voltage output is not received from the test structure. The on-chip switches pass the probe light when opened by the voltage output from the test structure. The on-chip switches block the probe light by remaining closed, when the voltage output is not received from the test structure.

12 Claims, 11 Drawing Sheets

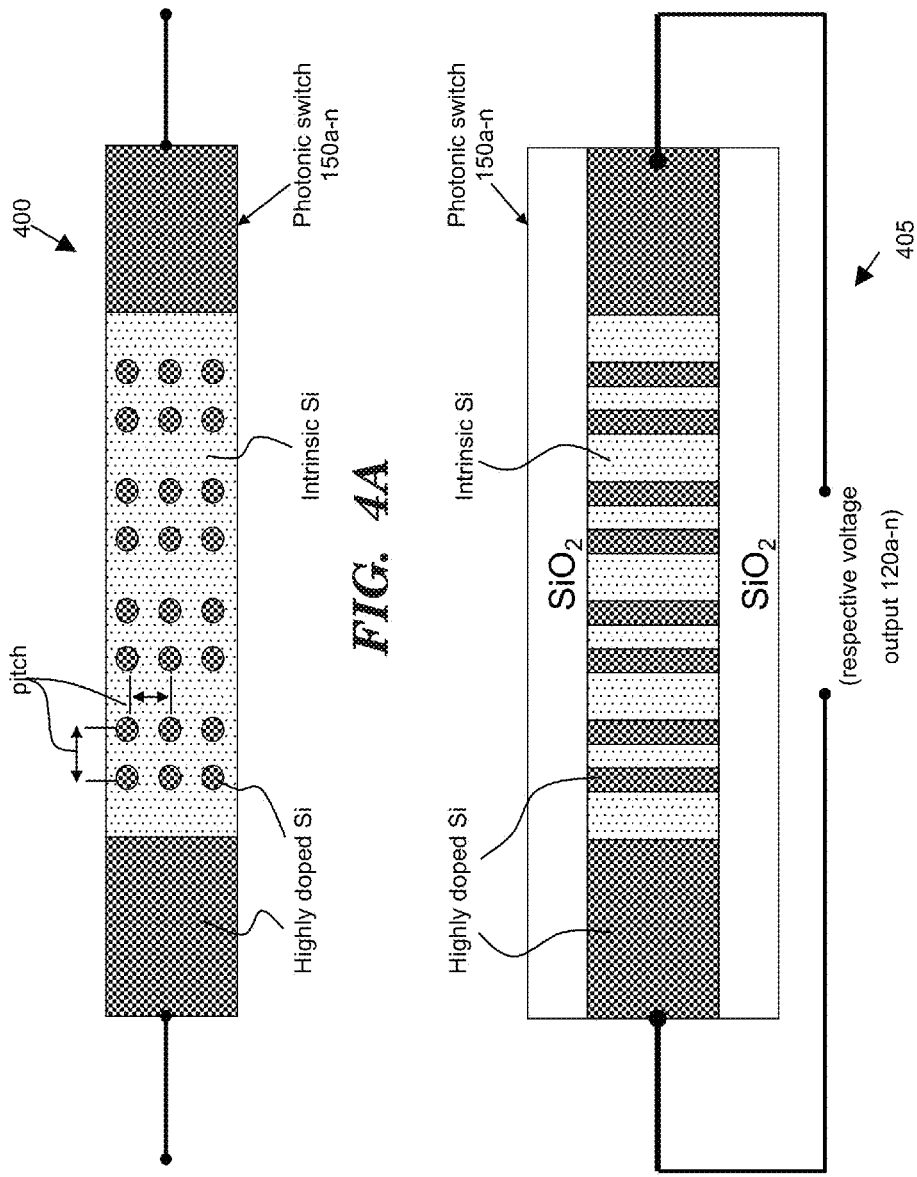

NONCONTACT ELECTRICAL TESTING WITH OPTICAL TECHNIQUES

BACKGROUND

Exemplary embodiments generally relate to electrical testing, and more specifically, to noncontact optical testing of electrical circuits.

During semiconductor technology development and manufacturing, defects and electrical properties must be routinely monitored. For example, the most common in-line tests for middle-of-the-line (MOL) and back-end-of-the-line (BEOL) structures are for electrical open and electrical short circuits.

The most common and reliable method is electrical open and short tests where voltage is applied through a test structure utilizing test probes and current is then measured. However, testing time is becoming a bottleneck as more and more test structures (such as circuits on a wafer) need to be tested along with the increasing complexity of semiconductor technologies.

Mechanical probes for making electrical contact are inserted/pressed into the wafer surface (e.g., a chip/device under test) to electrically connect to the contacts of a circuit (the test structure) that has been fabricated on the wafer. As a result of testing electrical circuits with these test probes, significant impact on yield and reliability by probe damage has been observed in advanced technologies. For example, probe damage to copper (Cu) pads and surrounding interlayer dielectric (ILD) may cause moisture permeation and electrical open in vias (i.e., holes made from inserting probes) near test structures.

BRIEF SUMMARY

According to an exemplary embodiment, an on-chip system for noncontact electrical testing of a test structure on a chip is provided. The on-chip system includes on-chip photodiodes configured to receive pump light from a pump light source, where the on-chip photodiodes are electrically connected to the test structure on the chip and configured to generate power for the test structure. An on-chip coupling unit is configured to receive probe light from a probe light source, and the on-chip coupling unit is optically connected to on-chip waveguides through which the probe light is transferred. On-chip switches are configured to open in response to receiving voltage output from the test structure, the on-chip switches remaining closed when the voltage output is not received from the test structure. The on-chip switches are configured to pass the probe light when opened by the voltage output from the test structure. The on-chip switches are configured to block the probe light by remaining closed, when the voltage output is not received from the test structure.

According to an exemplary embodiment, a substrate configured for noncontact electrical testing of a test structure on the substrate is provided. The substrate includes photodiodes configured to receive pump light from a pump light source, where the photodiodes are electrically connected to the test structure on the substrate and configured to generate power for the test structure. A coupling unit is configured to receive probe light from a probe light source, where the coupling unit is optically connected to waveguides through which the probe light is transferred. Switches are configured to open in response to receiving voltage output from the test structure, and the switches remain closed when the voltage output is not received from the test structure. The switches are configured to pass the probe light when opened by the voltage output from the test structure. The switches are configured to block the probe light by remaining closed, when the voltage output is not received from the test structure.

According to an exemplary embodiment, a method of conducting electrical testing of circuits under test on a chip without utilizing mechanical probes is provided. The method includes biasing photodiodes on the chip with pump light from a pump light source, where the photodiodes are electrically connected to the circuits under test in order to provide power to the circuits under test, and the circuits under test are electrically connected to switches on the chip such that one of the circuits under test is only electrically connected to one of the switches. The method includes providing probe light to a coupling unit on the chip, where the coupling unit is optically connected to waveguides to split the probe light into split beams of the probe light such that the split beams are individually distributed to the switches through waveguide. The switches are configured to open in response to receiving voltage output from the circuits under test, and the switches remain closed when the voltage output is not received from the circuits under test. The switches are configured to pass the split beams of the probe light when opened by the voltage output from the circuits under test. The switches are configured to block the split beams of the probe light by remaining closed, when the voltage output is not received from the circuits under test.

Additional features are realized through the techniques of the present disclosure. Other systems, methods, and/or apparatus according to other embodiments are described in detail herein and are considered a part of the claimed invention. For a better understanding of exemplary embodiments and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features of the present disclosure are apparent from the following detailed description taken in conjunction with the accompanying drawings in which:

FIG. 4A depicts a cross-sectional top view of a photonic switch according to an exemplary embodiment.

FIG. 4B depicts a cross-sectional side view of a photonic switch according to an exemplary embodiment.

DETAILED DESCRIPTION

Exemplary embodiments are configured to address the testing time issue by using waveguides to measure multiple test structures in parallel. Exemplary embodiments may include designing on-chip photodiodes, on-chip optical couplers, on-chip waveguides, on-chip optical switches, and on-chip light scatter units onto semiconductor wafers (and/or chips) to measure many test structures (i.e., circuits) simultaneously, and the techniques of making such measurements. Test structures and circuits may be utilized interchangeably to refer to numerous integrated circuits (IC) patterned on a wafer and/or a chip, as understood by one skilled in the art. The test structure and/or test circuit may be called the device under test.

The present disclosure provides an exemplary optical noncontact testing approach where an optical means is used in open and/or short circuit tests to avoid probing damage caused by utilizing physical probes. A technique (method) to conduct in-line tests on electrical open and/or short circuits using noncontact optical means may include providing electrical bias using optical equipment, determining electrical open and/or short circuits using optical equipment, measuring many test structures simultaneously, and providing addressable defect information. A test system to enable noncontact optical probing for tests on electrical open and/or short circuits of a wafer (and/or IC chip) may include providing electrical bias (voltage and/or current) using a pump light and on-chip photodiodes, determining electrical open and short circuits using a probe light and on-chip photonic switch, and providing waveguide structures on the chip for enablement (i.e., transferring the probe light).

Figure 1:
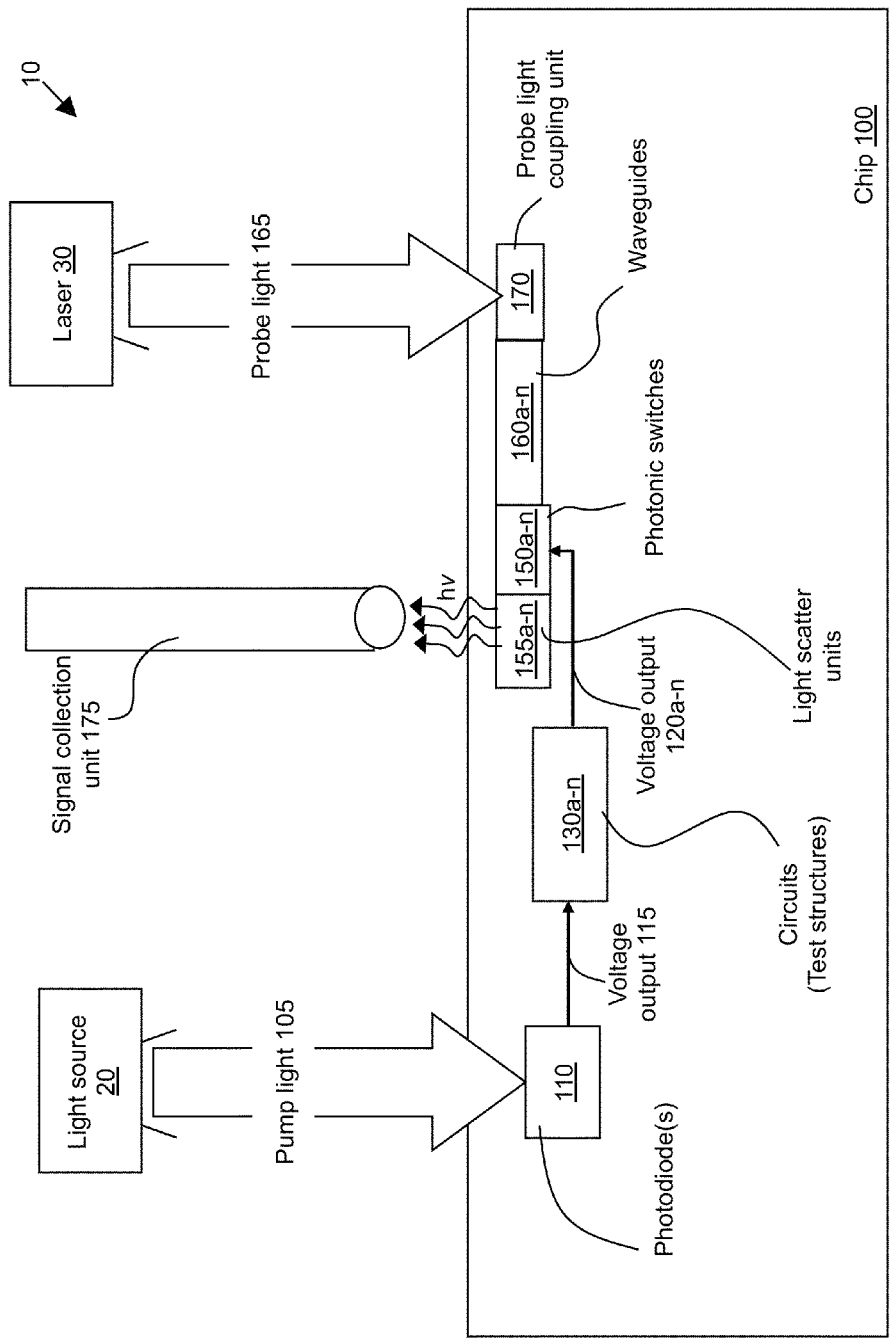
FIG. 1 is a high level diagram of a test system in accordance with an exemplary embodiment.

Now turning to the figures, FIG. 1 is a high level diagram of a test system 10 in accordance with an exemplary embodiment. For explanation purposes, the test system 10 is illustrated with a chip 100 such as a semiconductor chip, and it is understood that other types of chips and/or wafers may be utilized. Also, the chip 100 may be any substrate (e.g., silicon, germanium, etc.) on which circuits, devices, traces, etc., can be fabricated. For example, the chip 100 may be fabricated to include numerous circuits 130a-n to operate according to an intended purpose. The circuits 130a-n may represent various types of electrical devices that conduct electricity. The notation a-n represents multiples ones of the same element. Also, the notation a-n is used herein to designated a first element through a last element, in which each element designated with "a" corresponds to other elements designated with "a". The test system 10 is configured to electrically test the individual circuits 130a-n at the same time (i.e., in parallel) without using probes. As understood by one skilled in the art, a probe is a metal lead (i.e., a conductor) that can be utilized to selectively connect (insert) to individual circuits 130a-n to test whether any of the individual circuits 130a-n has an open circuit or short circuit defect.

However, in the test system 10, a light source 20 (e.g., a pump) irradiates pump light 105 onto photodiodes 110 to generate a voltage output 115. The light source 20 may be configured to generate the pump light 105, e.g., in the 500 nm-1000 nm range for silicon based photodiodes. Other wavelength ranges may be utilized for the pump light 105 when other substrates that are not silicon based.

Figure 2:
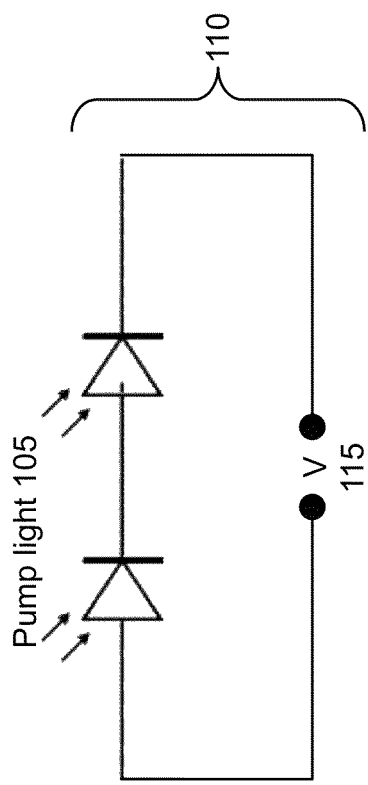
FIG. 2 is a diagram of photodiodes fabricated on a chip for converting light into electrical power according to an exemplary embodiment.

With reference to FIG. 2, the photodiodes 110 convert the pump light 105 into electrical power (i.e., voltage output 115) to be (simultaneously) applied to each of the circuits 130a-n under test, and the photodiodes 110 may be connected in series for a higher biasing voltage, i.e., a higher voltage output 115. Although two photodiodes 110 are illustrated in FIG. 1 for simplicity, the present disclosure is not meant to be limited. It is understood that numerous photodiodes 110 may be fabricated on the chip 100.

Figure 3A:
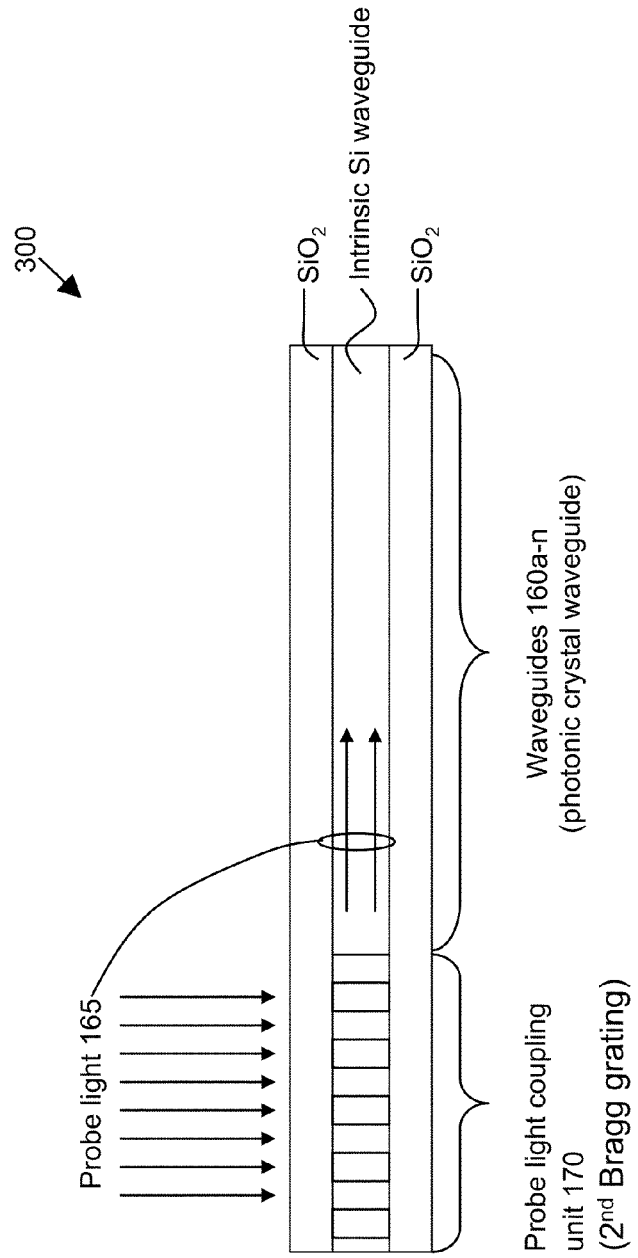
FIG. 3A depicts a cross-sectional side view of a probe light coupling unit connected to waveguides on a chip according to an exemplary embodiment.
Figure 3B:
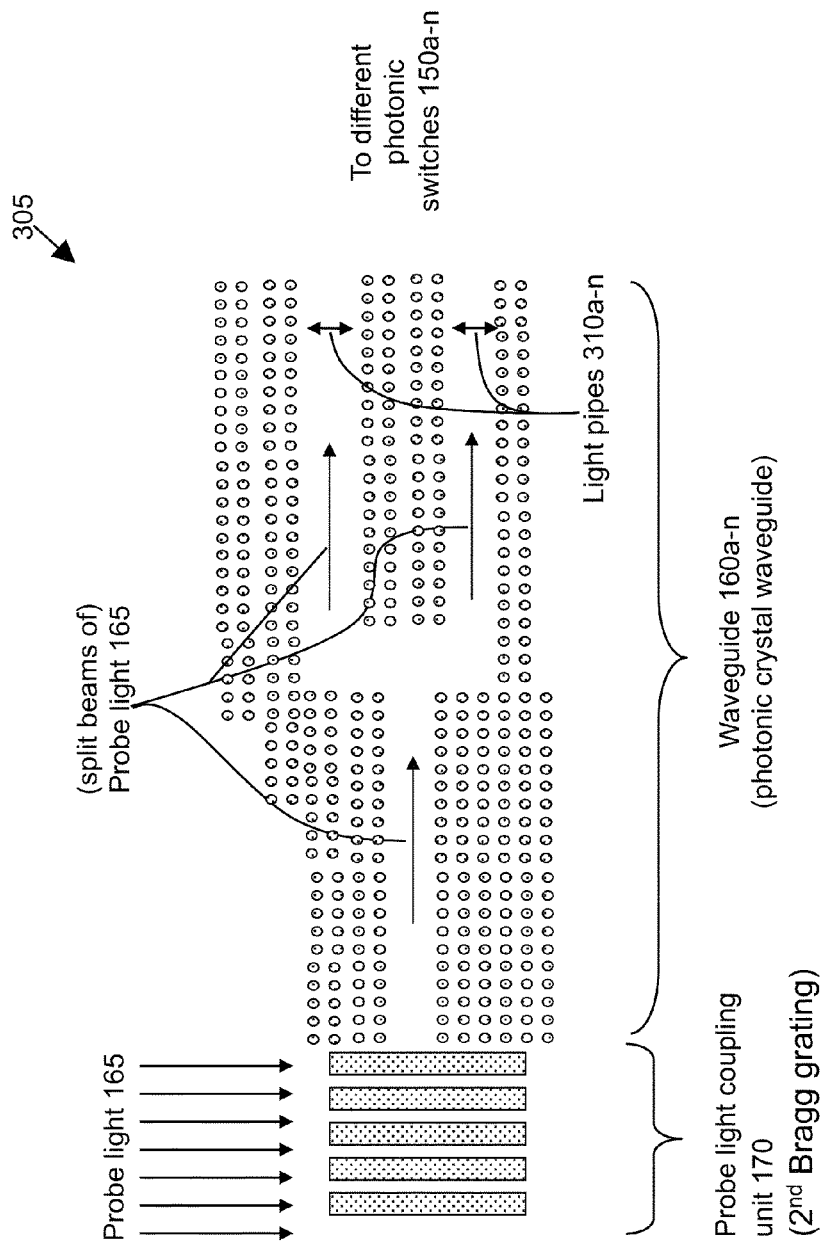
FIG. 3B depicts a cross-sectional top view of a probe light coupling unit connected to waveguides on a chip according to an exemplary embodiment.

Referring back to FIG. 1, the voltage output 115 is provided to the individual circuits 130a-n. Also, in the test system 10, a laser 30 (i.e., light source) is configured to irradiate probe light 165 onto a probe light coupling unit 170. The probe light coupling unit 170 is configured to receive the probe light 165 and direct the probe light 165 into individual waveguides 160a-n, in which each of the waveguides 160a-n corresponds to an individual circuit 130a-n. FIG. 3A depicts a cross-sectional side view 300 of the probe light coupling unit 170 (optically) connected to the waveguide 160a-n according to an exemplary embodiment. As one implementation of the probe light coupling unit 170, the cross-sectional side view 300 shows trenches (intrinsic silicon) etched in silicon with silicon dioxide ($SiO_2$) filling the trenches to form a second order Bragg order grating. When the laser 30 irradiates a vertical (infrared) beam of probe light 165 onto the probe light coupling unit 170, the probe light coupling unit 170 (e.g., a second order Bragg grating) redirects the probe light 165 into the waveguides 160a-n. The probe light 165 is generated at a wavelength of approximately 1.2 μm (infrared bandwidth range) which is compatible with the waveguides 160a-n. The waveguides 160a-n may be a silicon waveguide that can carry light in the infrared bandwidth range such as, e.g., at wavelength of 1.2 μm. FIG. 3B depicts a cross-sectional top view 305 of the probe light coupling unit 170 (optically) connected to the waveguides 160a-n according to an exemplary embodiment. As can be seen, the waveguide 160a-n is configured to split the beam of probe light 165 into multiple beams of probe light 165 in which each of the split beams of probe light 165 travels down an individual light pipe 310a-n. Each light pipe 310a-n is (optically) connected individually (exclusively) to a single photonic switch 150a-n, and each photonic switch 150a-n is individually electrically connected to a single circuit 130a-n under test. As such, a corresponding light pipe 310a-n of the waveguide 160a-n can transmit the split beam of probe light 165 to its corresponding one of the photonic switches 150a-n.

Referring back to FIG. 1, while the voltage output 115 from the photodiodes 110 acts as a voltage bias for each of the individual circuits 130a-n under test, each of the individual circuits 130a-n can then respectfully provide a voltage output 120a-n to its (respective) corresponding one of the photonic switches 150a-n, and the operation (and non-operation) of the photonic switches 150a-n can be utilized to individually show that a defect exists for any of the individual circuits 130a-n. The voltage output 120a-n from each respective circuit 130a-n under test can cause corresponding photonic switches 150a-n to open. Probe light 165 from laser 30 is received by the probe light coupling unit 170, redirected and split into the respective (i.e., light pipes 310a-n) waveguides 160a-n, and then directed from each waveguide 160a-n into corresponding photonic switches 150a-n. Through the photonic switches 150a-n, the probe light 165 is output via respective light scatter units 155a-n into a signal collection unit 175 for processing to determine if there are any defective circuits 130a-n. The light scatter units 155a-n redirects/emits the split beams of probe light 165 off the surface of the chip 100 to be collected by a signal collection unit 175.

Consider a case (which can apply to all circuits 130a-n) in which there is a defect in the circuit 130a. When the pump light 105 causes the photodiodes 110 to generate voltage output 115 for the input to the circuit 130a, the circuit 130a being defective (e.g., a short circuit and/or open circuit) will not be able to conduct electricity, and thus the circuit 130a would not provide the voltage output 120a to its corresponding photonic switch 150a. As such, the photonic switch 150a does not open, and probe light 165 through (via light pipe 310a) waveguide 160a (connected to photonic switch 150a) is blocked from exiting through the photonic switch 150a because the switch is closed. Consequently, the signal collection unit 175 does not receive/collect the probe light 165 corresponding to the circuit 130a (although the signal collection unit 175 may collect the probe light 165 corresponding to the locations of the other circuits 130b-n that do not have a defect).

Further regarding photonic switches 150a-n, FIG. 4A depicts a cross-sectional top view 400 of the photonic switches 150a-n, and FIG. 4B depicts a cross-sectional side view 405 of the photonic switches 150a-n according to an exemplary embodiment.

Due to the free carrier dispersion effect, the refractive index of silicon (Si) changes under an electrical field, such as the electric field produced by the voltage output 120a-n respectively corresponding to (and conducted through) circuits 130a-n. The photonic switches 150a-n are individual photonic crystal (PC) switches, and each of the photonic switches 150a-n are designed to be opaque (non-transparent, i.e., closed) with no bias (i.e., receiving no voltage output 120a-n from its corresponding circuit 130a-n). Yet, each of the photonic switches 150a-n are designed to be transparent (i.e., open) while its respective voltage output 120a-n is being received (i.e., when the voltage output 120a-n is provided through the respective circuit 130a-n). As such, the operation, such as open and/or close, of the individual photonic switches 150a-n determines whether there is a defect in its corresponding circuit 130a-n.

The photonic switches 150a-n are doped to have highly doped silicon trenches (or wells) within the intrinsic silicon. The pitch of the highly doped silicon trenches may be designed to have a pitch that causes the probe light 165 (with a wavelength of approximately 1.2 µm) to be 100% (and/or nearly 100%) transparent to the probe light 165 when an individual voltage output 120a-n is applied from a respective circuit 130a-n. At the same time, the pitch of the highly doped silicon trenches is such that the probe light 165 is 100% (and/or nearly 100%) non-transparent when no respective voltage output 120a-n is applied to its corresponding photonic switch 150a-n (i.e., the photonic switch 150a-n is closed).

Figure 5:
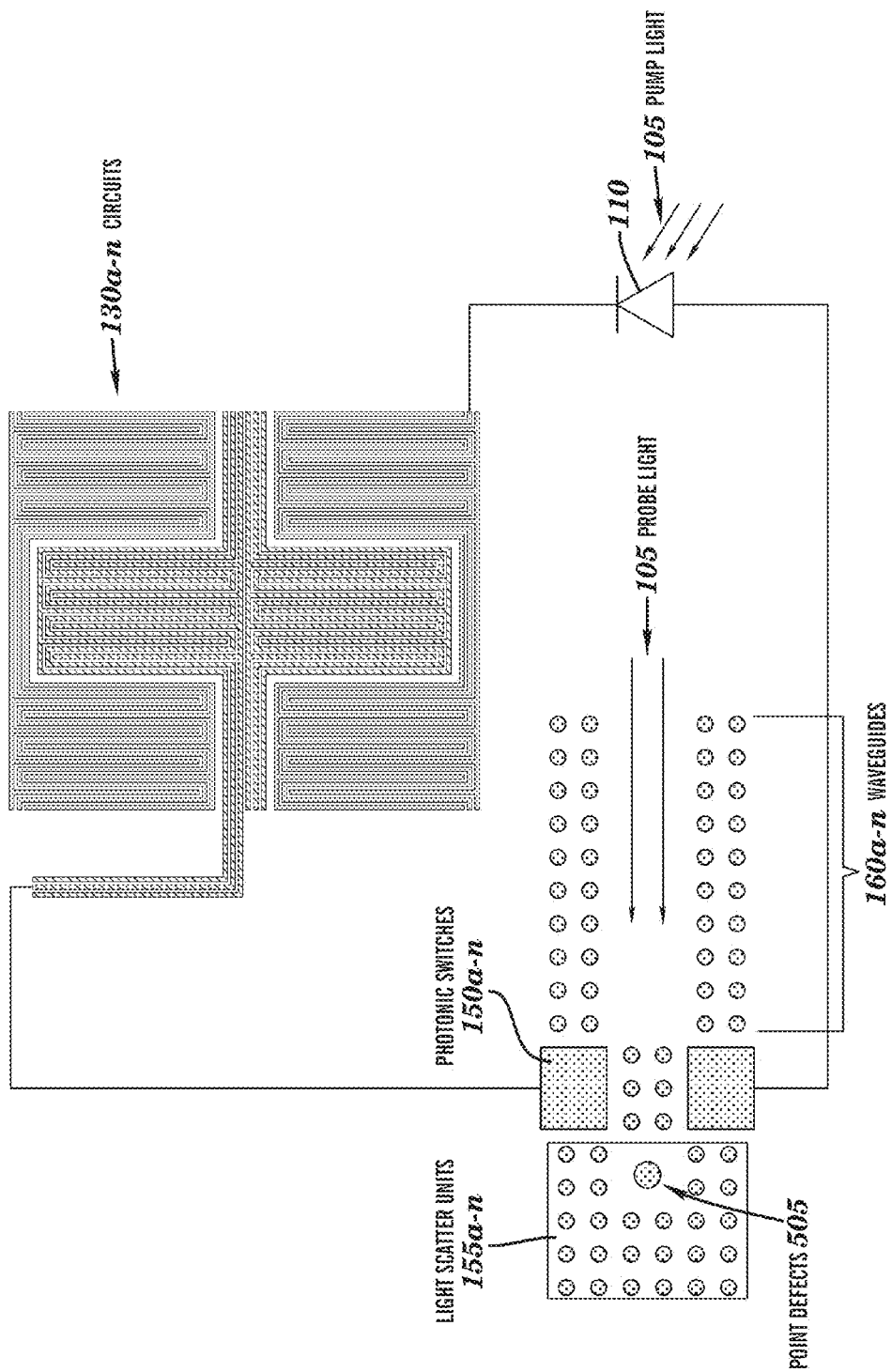
FIG. 5 illustrates details of a light scatter unit in a test system according to an exemplary embodiment.

FIG. 5 further illustrates details of the light scatter units 155a-n in the test system 10 according to an exemplary embodiment. Each light scatter unit 155a-n may be a photonic crystal that includes one or more point defects 505. These point defects 505 cause light, e.g., probe light 165, to be scattered out of the chip 100 (and/or wafer) into the signal collection unit 175. In effect, the point defects 505 in the light scatter units 155a-n redirect the probe light 165 from being parallel to the chip 100 to now be perpendicular (i.e., vertical) to the chip 100, such that the probe light 165 is emitted out of the chip 100 into the signal collection unit 175.

Figure 8:
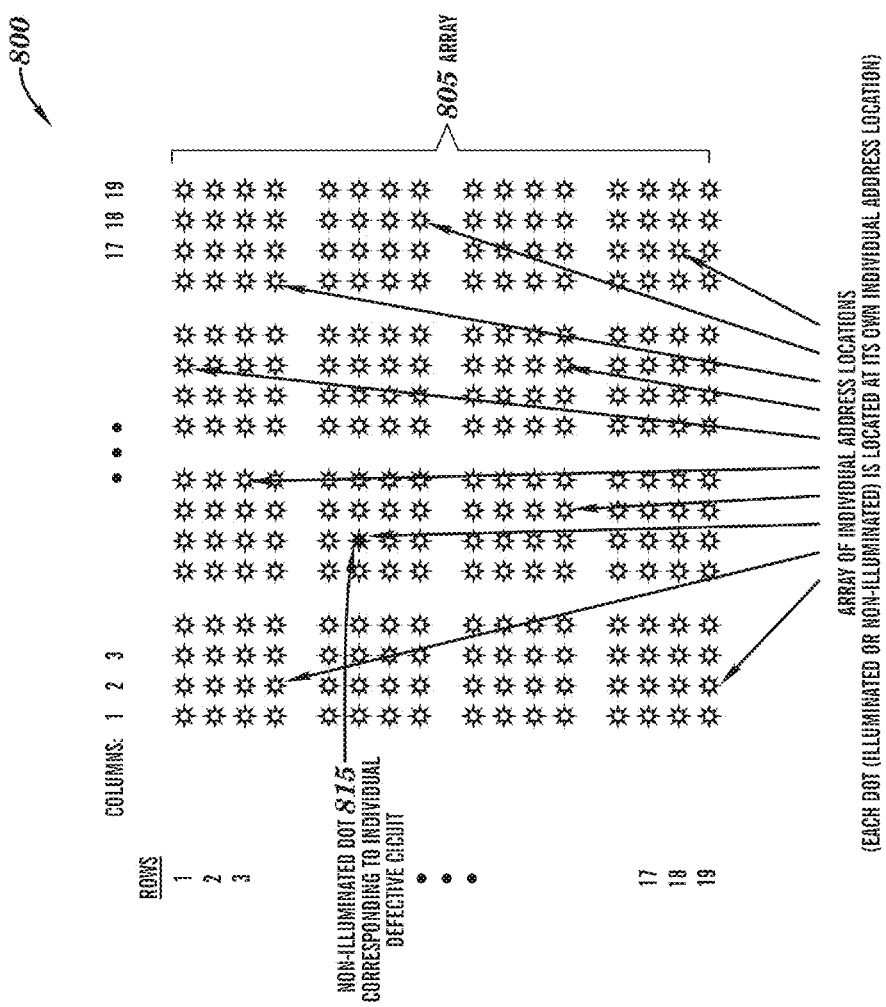
FIG. 8 illustrates displaying an array of individually addressed locations in an image captured by a charge coupled device/optical sensor when testing circuits on a chip according to an exemplary embodiment.

As discussed herein, the photodiodes 110 receive pump light 105 and generate voltage output 115 for each respective circuit 130a-n under test. The circuits 130a-n provide the voltage output 120a-n to its corresponding photonic switches 150a-n, thus causing the photonic switches 150a-n to open (i.e., transmit light) and the light scatter units 155a-n are designed to scatter the probe light 165 for each open photonic switch 150a-n received off the individual waveguides 160a-n. For example, when the probe light 165 travels through the open (transparent) photonic switch 150a, the probe light 165 hits one or more point defects 505 (in the photonic crystal) which scatters probe light 165 out of the waveguide 160a for output to the signal collection unit 175; this scattered light (exclusively) corresponds to the circuit 130a and can be identified in a captured image (as shown in FIG. 8). Note that at times (for simplicity and ease of understanding) examples are provided that relate to the circuit 130a and its corresponding elements designated with "a". However, examples related to circuit 130a and its corresponding elements designated with "a" apply to all circuits 130a-n and their corresponding elements designated with "a" occur simultaneously (or nearly simultaneously) for all the circuits 130a-n and their corresponding elements in the test system 10.

Figure 6:
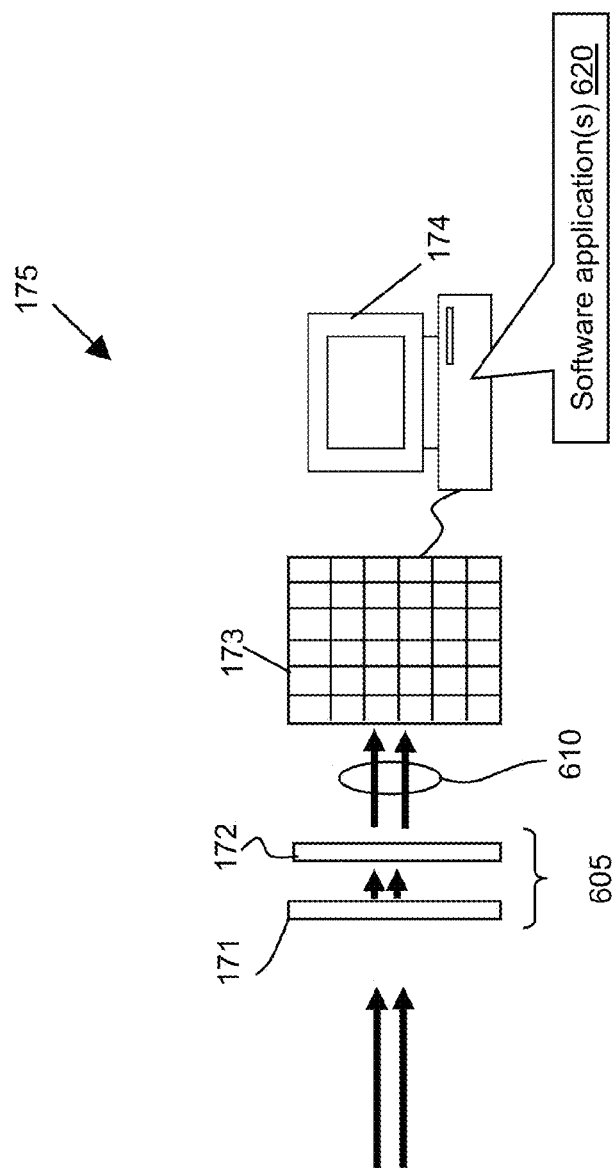
FIG. 6 depicts a signal collection unit according to an exemplary embodiment.

FIG. 6 illustrates details of the signal collection unit 175 according to an exemplary embodiment. The signal collection unit 175 may include a filter unit 605 placed before a charge coupled device (CCD)/optical sensor 173 to filter background light.

For example, a long wavelength pass filter 171 is designed to stop light irradiated by the pump light 105 from entering the CCD/optical sensor 173. A polarizer 172 is designed to stop any pump light 105 that is not directly transmitted in the waveguides 160a-n from entering the CCD/optical sensor 173. The CCD/optical sensor 173 collects the output signal 610 which is (only) the probe light 165 emitted from the light scatter units 155a-n via photonic switches 150a-n. For example, the CCD/optical sensor 173 is configured to capture an image (as shown in FIG. 8). A computer system 174 is configured to store and (individually) analyze the output signal 610, i.e., test data, from each of the circuits 130a-n. For explanation purposes, the top arrow with diagonal lines is blocked by the long wavelength pass filter 171 because this is pump light 105. The next arrow with vertical lines is blocked by the polarizer 172 because this is probe light 165 not directly transmitted in the waveguides 160a-n. The bottom two solid arrows represent pump light 105 emitted from the light scatter units 155a-n via photonic switches 150a-n and are captured as the output signal 610.

The computer system 174 may be one or more servers or any type of processing device. The computer system 174 may include and/or be coupled to memory, a communication interface, a display screen, user interfaces, processors, and software applications 620. The communication interface may include hardware and software for communicating over a network or any type of connection. The communication interface is operatively connected to CCD/optical sensor 173 and receives the output signal 610 from the CCD/optical sensor 173. The user interfaces 50 may include, e.g., a track ball, mouse, pointing device, keyboard, touch screen, microphone, etc, for interacting with the computer system 174, such as inputting information, making selections, etc.

The computer system 174 includes memory which may be a computer readable storage medium. One or more software applications may reside on and/or be coupled to the memory, and the software applications 620 have logic and software components to operate and function in accordance with exemplary embodiments in the form of computer executable instructions. The software applications 620 may include a graphical user interface (GUI) which the user can view and interact with on the display screen. The software application 620 is configured to receive, store, and (individually) analyze the output signal 610, i.e., test data, from each of the circuits 130a-n. The software application 620 is configured to display an image (as shown in FIG. 8) of the individual points of the probe light 165 corresponding to each of the circuits 130a-n that caused their respective photonic switches 150a-n to be opened for emitting the probe light 165.

Figure 7A:
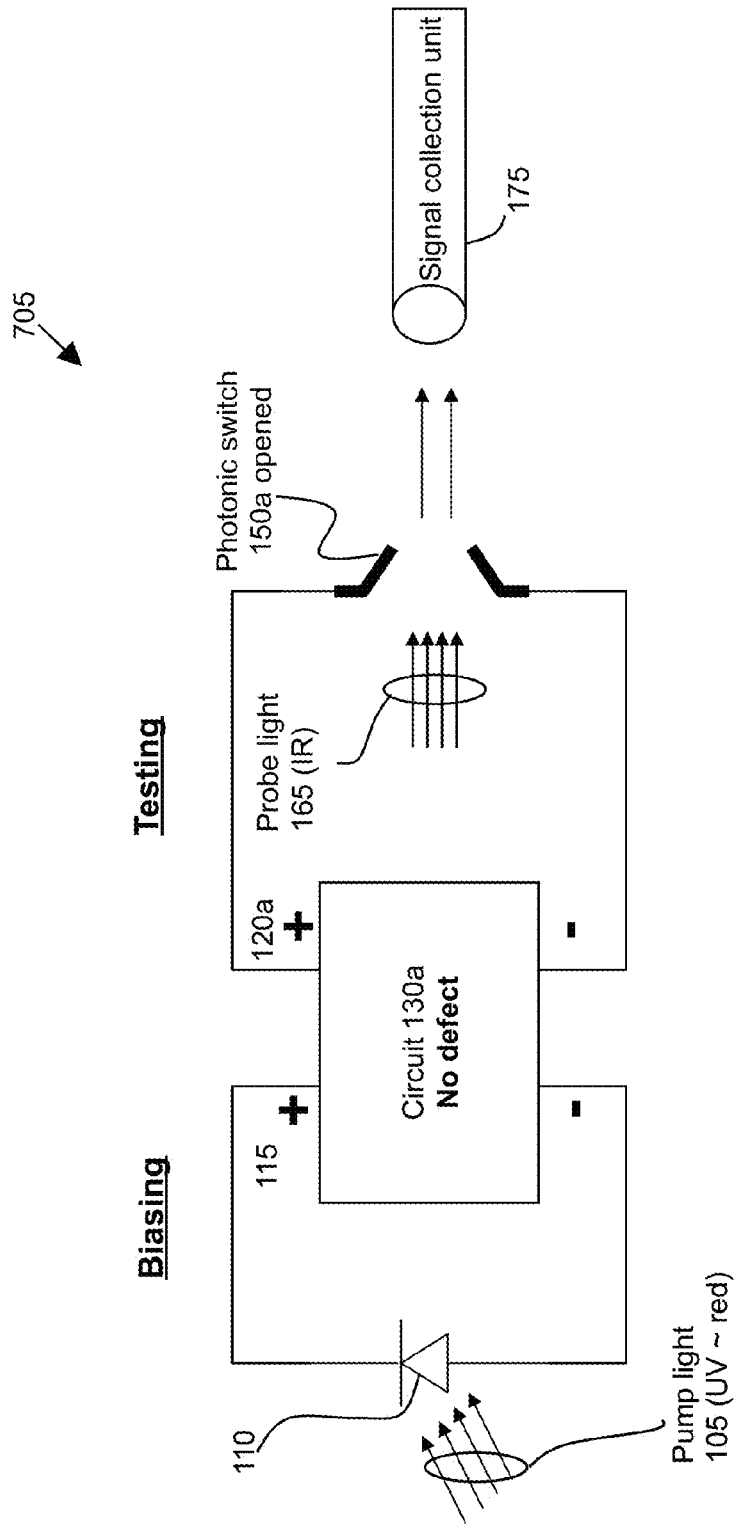
FIG. 7A illustrates testing a circuit with no defect in a test circuit according to an exemplary embodiment.

FIG. 7A illustrates an operation 705 of the test system 10 according to an exemplary embodiment. For the sake of brevity, certain elements in the test system 10 are not shown in the operation 705 (and operation 710 of FIG. 7B) but these elements are understood to be part of the test system 10. Also, for ease of understanding, examples are again shown for the circuit 130a under test but equally apply in parallel (i.e., occur at the same time) to the circuits 130a-n. As discussed above, the pump light 105 is received by the photodiodes 110, and the photodiodes 110 provide voltage output 115 to the circuit 130a. The voltage output 115 is a voltage bias that causes the circuit 130a to provide the voltage output 120a, if there is no defect in the circuitry and/or device(s) forming the circuit 130a. The voltage output 120a is a voltage bias that generates an electric field necessary to open (i.e., cause the photonic switch 150a to be transparent to light) the photonic switch 150a. While the voltage output 120a is causing the photonic switch 150a to be open, the probe light 165 from the waveguide 160a is transmitted through the opened photonic switch 150a into the signal collection unit 175 via the light scatter unit 155a.

Figure 7B:
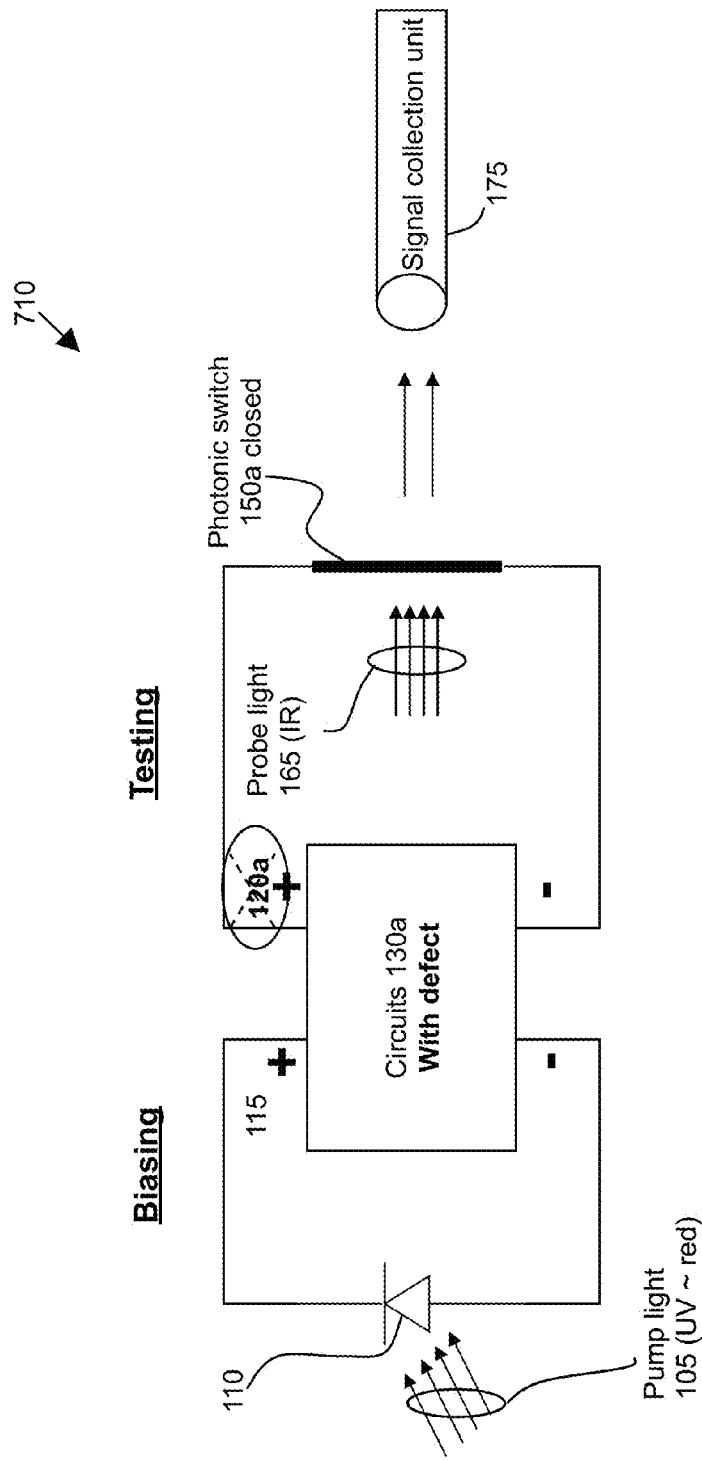
FIG. 7B illustrates testing a circuit with a defect in a test circuit according to an exemplary embodiment.

In FIG. 7B, the operation 710 of the test system 10 illustrates a case in which the circuit 130a has a defect. As discussed above, the pump light 105 is received by the photodiodes 110, and the photodiodes 110 provide voltage output 115 to the circuit 130a. In this case, the voltage output 115 does not cause the circuit 130a to provide the voltage output 120a because there is a defect in the circuitry and/or device(s) forming the circuit 130a. As such, the photonic switch 150a remains closed, i.e., the photonic switch 150a blocks the probe light 165 transmitted from the waveguide 160a. Since no probe light 165 corresponding to the circuit 130a can pass through the photonic switch 150a, the signal collection unit 175 receives no probe light 165 corresponding to the circuit 130a (i.e., receives no probe light 165 at the addressable location that coincides with the circuit 130a). Thus, the signal collection unit 175 is configured to recognize that a defect exists for the circuit 130a (at its respective addressable location), along with any other circuits 130a-n that do not allow the probe light 165 to pass through their respective photonic switch 150a-n. This is because each circuit 130a-n has its own corresponding addressable location (i.e., address) on the CCD/optical sensor 173, which can be captured in the image shown in FIG. 8. Accordingly, when no probe light 165 is collected by the signal collection unit 175 for a particular addressable location, the computer system 174 is configured to determine which of the circuits 130a-n is defective because the defective circuits 130a-n have no probe light 165 at their location (in, e.g., an array of lights/dots).

FIG. 8 illustrates displaying on the computer system 174 an array 805 of individually addressed locations in an image (e.g., picture) 800 captured by the CCD/optical sensor 173 when the circuits 130a-n are being simultaneously tested (i.e., in parallel) in the test system 10 by using optical light (e.g., pump light 105 and probe light 165) according to an exemplary embodiment. In FIG. 8, one address location in the image 800 corresponds to (exactly) one circuit in the circuits 130a-n. In other words, each individual circuit 130a-n is mapped to one addressable location in the image 800. In one implementation, each individual circuit 130a-n can be mapped to a (single) pixel position on the image 800, and accordingly, each defective circuit in the circuits 130a-n is addressable.

In one implementation, an array 805 of dots can be seen in the image 800 at the individually addressed locations. Each dot represents an individually addressed location that an illumination of a split beam of probe light 165 should be captured to correspond to an individual one of the circuits 130a-n. If one (or more) of the dots is not illuminated on the image 800, this dot(s) is considered as a non-illuminated (defective) dot 815 (i.e., identifying a defective circuit 130a-n) by the software application 620. Based on the individually addressed location of this non-illuminated dot 815 in the array 805 in the image 800, the software application 620 is configured to map the individually addressed location of the non-illuminated defective dot 815 in the array 805 to a particular defective circuit 130a-n.

In a case where there are numerous non-illuminated dots 815 at their individually addressed locations in the image 800, the software application 620 is configured to (simultaneously) map each individually addressed location of the non-illuminated dots 815 in the array 805 to a particular circuit 130a-n on the chip 100 such that defective circuits can be differentiated from non-defective circuits in the circuits 130a-n; the software application 620 can then display/identify on the chip 100 the corresponding defective circuits 130a-n for the user. Since the test system 10 is designed to test all of the circuits 130a-n at one time using the noncontact approach discussed herein, the time for testing all the circuit 130a-n can be reduced. Further, the noncontact testing prevents the risk of causing probe damage by testing probes. Also, since light (i.e., pump light 105 and probe light 165) is utilized to test the circuits 130a-n, the circuits 130a-n can be fabricated on the chip 100 without the (copper) contact pads that would be needed for physically touching/pressing probes against each of the individual circuit 130a-n.

Each of the photodiodes 110, light scatter units 155a-n, photonic switches 150a-n, waveguides 160a-n, and the probe light coupling unit 170 can be fabricated directly on the chip 100 without special processing; these are all on-chip elements.

Figure 9:
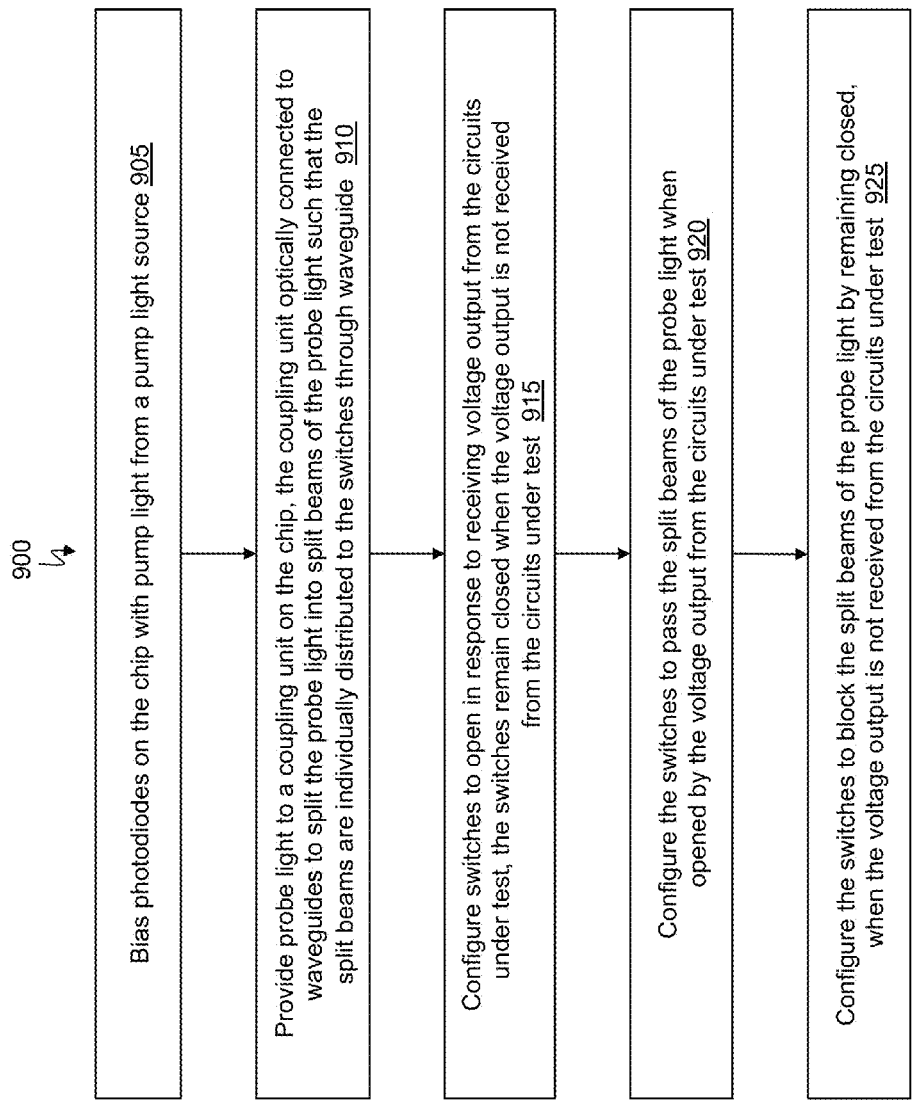
FIG. 9 is a noncontact method for testing circuits in a test system according to an exemplary embodiment.

FIG. 9 illustrates a noncontact method 900 for simultaneously, electrically testing circuits 130a-n in the test system 10 without utilizing mechanical probes according to an exemplary embodiment.

At block 905, the photodiodes 110 on the chip 100 are biased with pump light 105 from the pump light source 20; the photodiodes 110 are electrically connected to the circuits 130a-n under test in order to provide power (e.g., the voltage output 115) to the circuits 130a-n under test, where the circuits 130a-n under test are individually, electrically connected to (exactly one of) the photonic switches 150a-n on the chip 100 such that one of the circuits 130a-n under test is only electrically connected to one of the photonic switches 150a-n.

The probe light 165 is irradiated/provided to the probe light coupling unit 170 on the chip 100 at block 910. The probe light coupling unit 170 is optically connected to waveguides 160a-n to split the probe light 165 into split beams of the probe light 165 such that the split beams are individually distributed to the photonic switches 150a-n through respective waveguides 160a-n. One photonic switch 150a-n receives only one split beam of the probe light 165.

The photonic switches 150a-n are configured to open (i.e. transparent) when they receive their respective voltage output 120a-n from the circuits 130a-n under test, and the photonic switches 150a-n remain closed (i.e., opaque to block light)

when the voltage output 120a-n is not received from its respective one of the circuits 130a-n under test at block 915.

The photonic switches 150a-n are configured to pass the split beams of the probe light therethrough when opened by the voltage output 120a-n from the circuits 130a-n under test at block 920.

The photonic switches 150a-n are configured to block the split beams of the probe light 165 by remaining closed, when the voltage output 120a-n is not received from the circuits 130a-n under test at block 925.

Further, the signal collection unit 175 captures in the image 800 (e.g., a picture) the split beams of the probe light 165 that passed through the photonic switches 150a-n opened by the voltage output 120a-n from the circuits 130a-n under test to determine defective circuits under test. The split beams that pass through the open photonic switches 150a-n may hit point defects 505 to be scatter/emitted out of the chip 100 for collection the by the signal collection unit 175. The image 800 includes indications (i.e., illuminated dots) corresponding to each of the split beams that passed through the photonic switches 150a-n opened by the voltage output 120a-n from the circuits 130a-n under test; the image 800 is void of the indications (such as by the non-illuminated dot 815) for the defective circuits 130a-n under test when the defective circuits under test provide no voltage output to open their corresponding ones of the photonic switches 150a-n.

Although the image 800 only shows one non-illuminated dot 815 to indicate that there is only one defective circuit in the circuits 130a-n, in another case, the image 800 may show multiple non-illuminated dots 815 each at their own individual address location. These multiple non-illuminated dots 815 may indicate, e.g., that 5 defective circuits are in the circuits 130a-n under test as determined by the software application 620. Since the software application 620 stores a one-to-one mapping for each of the individual address locations in the image 800 to its corresponding (exactly one) one the circuits 130a-n, the software application 620 is configured to identify the 5 defective circuits (of the circuits 130a-n) on the chip 100.

In other words, since the image 800 includes one individual address location for each of the circuits 130a-n under test, the software application 620 is configured determine the defective circuits 130a-n under test that provide no voltage output 120a-n to open their corresponding ones of the photonic switches 150a-n by mapping the individual address locations in the image 800 that have no indications (i.e., no illumination from their respective split beams (as illustrated by the non-illuminated dot 815) to the defective circuits 130a-n under test physically located on the chip 100.

Additionally, the photonic switches 150a-n are not part of the circuits 130a-n under test and the photonic switches 150a-n are not being tested. Rather, the photonic switches 150a-n are the mechanism and/or gateway to determine if a circuit 130a-n is defective or not because any defective circuits in the circuits 130a-n under test is not able to provide its voltage output 120a-n to its particular photonic switch 150a-n.

It is understood that each circuit 130a-n has its own corresponding elements for testing if there is a defect. For example, a first one of the circuits 130a-n under test (such as circuit 130a) corresponds to a first one of the photonic switches 150a-n (such as photonic switch 150a), a first one of the split beams of the probe light 165, and a first one of the individual address locations (e.g., the first row in the first column) in the image 800. Accordingly, the first one of the photonic switches 150a-n (e.g., photonic switch 150a) only receives the first one of the split beams of the probe light 165 to be passed or blocked based on whether the first one of the circuits 130a-n (e.g., circuit 130a) under test provides its first one of the voltage output 120a-n (e.g., voltage output 120a) to open the first one of the photonic switches 150a-n (e.g., photonic switch 150a). In response to the first one of the circuits 130a-n under test not providing the first one of the voltage output 120a-n (e.g., voltage output 120a) to open the first one of the photonic switches 150a-n (e.g., photonic switches 150a), the first one of the split beams is blocked from being captured in the image 800 and the first one of the individual address locations (e.g., first row in the first column) in the image 800 is identified as having a defective circuit.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the exemplary embodiments of the invention have been described, it will be understood that those skilled in the art, both now and in the future, may make various improvements and enhancements which fall within the scope of the claims which follow. These claims should be construed to maintain the proper protection for the invention first described.

What is claimed is:

1. An on-chip system for noncontact electrical testing of a test structure on a chip, comprising:
   on-chip photodiodes configured to receive pump light from a pump light source, the on-chip photodiodes being individually electrically connected to a plurality of test circuits on the test structure on the chip and being configured to generate power for the plurality of test circuits on the test structure;
   an on-chip coupling unit configured to receive probe light from a probe light source, the on-chip coupling unit being optically connected to on-chip waveguides through which the probe light is transferred; and corresponding ones of on-chip switches configured to open in response to respectively receiving separate voltage outputs from the plurality of test circuits on the test structure, the corresponding ones of the on-chip switches remaining closed respectively when the separate voltage outputs are not received from the plurality of test circuits on the test structure;

wherein the corresponding ones of the on-chip switches are configured to pass the probe light when respectively opened by the separate voltage outputs from the plurality of test circuits on the test structure;

wherein the corresponding ones of the on-chip switches are configured to block the probe light by remaining closed, when the separate voltage outputs are not respectively received from the plurality of test circuits on the test structure;

wherein the plurality of test circuits are respectively electrically connected to the corresponding ones of the on-chip switches;

wherein the corresponding ones of the on-chip switches are respectively optically connected to corresponding ones of the on-chip waveguides;

wherein the corresponding ones of the on-chip switches are configured to pass the probe light for the plurality of test circuits that provide the separate voltage outputs to the corresponding ones of the on-chip switches, in order to cause a signal collection unit to capture an image of the probe light for the plurality of test circuits that provide the separate voltage outputs.

2. The system of claim 1, wherein the test structure comprises the plurality of test circuits that are formed on the chip.

3. The system of claim 1, wherein in response to at least one of the plurality of test circuits failing to respectively provide a separate voltage output to a single corresponding one of the on-chip switches, the single corresponding one of the on-chip switches is configured to block the probe light from being transmitted therethrough in response to the single corresponding one of the on-chip switches being electrically connected to the at least one of the plurality of test circuits failing to respectively provide the separate voltage output.

4. The system of claim 1, wherein the image of the probe light comprises individual address locations for each of the plurality of test circuits, in order for the plurality of test circuits that provide the voltage output to be differentiated from the plurality of test circuits that fail to provide the voltage output.

5. The system of claim 4, wherein defective test circuits of the plurality of test circuits can be identified by the individual address locations having no probe light present in the image.

6. The system of claim 1, wherein each of the plurality of test circuits has a one-to-one mapping to individual address locations on the image, such that defective test circuits of the plurality of test circuits are identified by an absence of the probe light at the individual address locations mapped to the defective test circuits.

7. A substrate configured for noncontact electrical testing of a test structure on the substrate, the substrate comprising:
photodiodes configured to receive pump light from a pump light source, the photodiodes being individually electrically connected to a plurality of test circuits on the test structure on the substrate and being configured to generate power for the plurality of test circuits on the test structure;
a coupling unit configured to receive probe light from a probe light source, the coupling unit being optically connected to waveguides through which the probe light is transferred; and
corresponding ones of switches configured to open respectively in response to receiving separate voltage outputs from the plurality of test circuits on the test structure, corresponding ones of the switches remaining closed respectively when the separate voltage outputs are not received from the plurality of test circuits on the test structure;

wherein the corresponding ones of the switches are configured to pass the probe light when respectively opened by the separate voltage outputs from the plurality of test circuits on the test structure; and wherein the corresponding ones of the switches are configured to block the probe light by remaining closed, when the separate voltage outputs are not respectively received from the plurality of test circuits on the test structure;

wherein the plurality of test circuits are respectively electrically connected to the corresponding ones of the switches;

wherein the corresponding ones of the switches are respectively optically connected to corresponding ones of the waveguides;

wherein the corresponding ones of the switches are configured to pass the probe light for the plurality of test circuits that provide the separate voltage outputs to the corresponding ones of the switches, in order to cause a signal collection unit to capture an image of the probe light for the plurality of test circuits that provide the separate voltage outputs.

8. The substrate of claim 7, wherein the test structure comprises the plurality of test circuits that are formed on the substrate.

9. The substrate of claim 7, wherein in response to at least one of the plurality of test circuits failing to respectively provide a separate voltage output to a single corresponding one of the switches, the single corresponding one of the switches is configured to block the probe light from being transmitted therethrough in response to the single corresponding one of the switches being electrically connected to the at least one of the plurality of test circuits failing to respectively provide the separate voltage output.

10. A method of conducting electrical testing of circuits under test on a chip without utilizing mechanical probes, the method comprising:
biasing photodiodes on the chip with pump light from a pump light source, the photodiodes being electrically connected to the circuits under test in order to provide power to the circuits under test, wherein the circuits under test are electrically connected to switches on the chip such that one of the circuits under test is only electrically connected to one of the switches;
providing probe light to a coupling unit on the chip, the coupling unit optically connected to waveguides to split the probe light into split beams of the probe light such that the split beams are individually distributed to the switches through waveguide;
wherein the switches are configured to open in response to receiving voltage output from the circuits under test, the switches remaining closed when the voltage output is not received from the circuits under test;
wherein the switches are configured to pass the split beams of the probe light when opened by the voltage output from the circuits under test; and
wherein the switches are configured to block the split beams of the probe light by remaining closed, when the voltage output is not received from the circuits under test;

capturing in an image the split beams of the probe light that passed through the switches opened by the voltage output from the circuits under test to determine defective circuits under test;

wherein the image comprises indications corresponding to each of the split beams that passed through the switches opened by the voltage output from the circuits under test;

wherein the image is void of the indications for the defective circuits under test when the defective circuits under test provide no voltage output to open their corresponding ones of the switches.

11. The method of claim 10, wherein the image comprises individual address locations for each of the circuits under test;

further comprising determining the defective circuits under test that provide no voltage output to open their corresponding ones of the switches by mapping the individual address locations in the image that have no indications to the defective circuits under test physically located on the chip.

12. The method of claim 10, wherein the switches are not part of the circuits under test and are not being tested.

* * * * *